United States Patent [19]

Wang et al.

[11] 4,376,663

[45] Mar. 15, 1983

[54] METHOD FOR GROWING AN EPITAXIAL LAYER OF CDTE ON AN EPITAXIAL LAYER OF HGCDTE GROWN ON A CDTE SUBSTRATE

[75] Inventors: Cheng-Chi Wang; Muren Chu, both of Thousand Oaks, Calif.

[73] Assignee: The United States of America as represented by the Secretary of the Army, Washington, D.C.

[21] Appl. No.: 328,766

[22] Filed: Dec. 8, 1981

Related U.S. Application Data

[62] Division of Ser. No. 207,863, Nov. 18, 1980, Pat. No. 4,357,620.

[51] Int. Cl.$^3$ ........................................... H01L 21/208
[52] U.S. Cl. .................................. 148/171; 148/172; 29/572; 29/576 E
[58] Field of Search .............. 148/171, 172; 29/576 E, 29/572; 357/30

[56] References Cited

U.S. PATENT DOCUMENTS

| | | | |
|---|---|---|---|
| 3,718,511 | 2/1973 | Moulin | 148/171 |
| 3,809,584 | 5/1974 | Akai et al. | 148/171 X |
| 3,858,306 | 1/1975 | Kloek et al. | 148/171 |
| 3,884,788 | 5/1975 | Maclolek et al. | 148/171 X |
| 3,902,924 | 9/1975 | Maclolek et al. | 148/171 X |
| 3,988,774 | 10/1976 | Cohen-Solal et al. | 29/572 X |
| 4,190,486 | 2/1980 | Kyle | 148/171 X |
| 4,228,365 | 10/1980 | Gutierrez et al. | 148/171 X |
| 4,236,947 | 12/1980 | Baliga | 148/171 |
| 4,263,065 | 4/1981 | Wang et al. | 148/171 |

OTHER PUBLICATIONS

Appl. Phys. Lett., vol. 32, (1978), R. A. Chapmon et al, Apr. 1, 1978, pp. 434–436.
Appl. Phys. Lett., vol. 34, (1979), M. Lanir et al, Jan. 1, 1979, pp. 50–52.

*Primary Examiner*—G. Ozaki
*Attorney, Agent, or Firm*—John H. Raubitschek; Werten F. W. Bellamy; Jack W. Voigt

[57] ABSTRACT

Disclosed is a method of growing a layer of CdTe on HgCdTe by liquid phase epitaxy. The solution for growth comprises Sn and Hg with a small amount of CdTe. A typical composition is Sn:Hg:CdTe=36:5:0.15 parts by weight. The growth temperature is a function of the amount of CdTe in solution. For the typical composition stated, the growth temperature is about 520° C. The layers were grown on (111)A oriented CdTe substrates. The HgCdTe epilayer with a desired Cd composition is first grown, and an epilayer of CdTe is subsequently grown on the HgCdTe epilayer. The cross-diffusion at the CdTe/$Hg_{1-x}Cd_xTe$ interface has been as small as 0.3 μm for the thin CdTe epilayer. The first CdTe/HgCdTe heterojunction sensitive to ~2.8 μm at 77K has been demonstrated.

3 Claims, 5 Drawing Figures

METHOD FOR GROWING AN EPITAXIAL LAYER OF CDTE ON AN EPITAXIAL LAYER OF HGCDTE GROWN ON A CDTE SUBSTRATE

DEDICATORY CLAUSE

The invention described herein was made in the course of or under a contract or subcontract thereunder with the Government; therefore, the invention described herein may be manufactured, used, licensed by or for the Government for governmental purposes without the payment of any royalties thereon.

CROSS REFERENCE TO RELATED APPLICATION

This is a division of application Ser. No. 207,863 filed Nov. 18, 1980 now Pat. No. 4,357,620.

BACKGROUND OF THE INVENTION

Since the advent of charge coupled devices, a new generation of signal processing techniques has evolved. Progress has shown that the silicon charge transfer device is one of the most important concepts in realizing visible imagers. Extending this technology to the infrared field has recently been the subject of intensive study in focal plane design for advanced military systems. Two approaches can essentially accomplish the same goal, namely, hybrid and monolithic focal planes. Hybrid focal planes, which involve mating sensitive intrinsic detectors to Si signal multiplexers or equivalent, are a nearterm solution to system problems. In monolithic focal planes, photon detection and signal processing are accomplished in one semi-conductor and consequently, are cost effective in the long run.

The building blocks of monolithic infrared focal planes need not be restricted to extrinsic Si; other semiconductors can be developed and tailored to specific needs of systems. In fact, besides potentially higher temperature of operation, infrared focal planes using intrinsic semiconductors have an additional important advantage over Si in that a heterojunction structure can be designed to detect low infrared (IR) energy in the narrow gap semiconductor and transfer the resulting charges to the wider gap semiconductor for signal processing.

Mercury-cadmium telluride, ($Hg_{1-x}Cd_xTe$), which is an important intrinsic semiconductor for the fabrication of photovoltaic and photoconductive infrared detectors, can be tailored to cover a wide spectral range from visible to over 30 μm. Although numerous techniques for growing HgCdTe bulk crystals have successfully been developed, the various techniques for growth of HgCdTe epitaxial layers have had limited success until modified liquid phase epitaxial (LPE) techniques were developed. LPE solves two typical problems encountered in the HgCdTe bulk crystal growth: compositional non-uniformity, and long annealing time to reach homogeneity. HgCdTe epitaxial layers also have the advantage of being suitable for making backside-illuminated detectors. In addition, LPE techniques can be adopted for growing HgCdTe multilayers which can be used for the fabrication of monolithic HgCdTe detectors and charge-coupled devices (CCD).

Advantageous would be a process for growing a layer of CdTe on a HgCdTe epitaxial layer that has been grown on a substrate of CdTe. The structure resulting from the above process offers the advantages of a backside-illuminated system since the CdTe substrate is transparent to IR. Since CdTe has a wide bandgap ($Eg = 1.6$ eV), the dark current of a charge-coupled device would be low. The CdTe layer could serve as a signal processer after a low level of IR is detected by a HgCdTe layer.

Therefore, an object of this invention is to provide a method of growing by liquid-phase epitaxial growth multilayers of $CdTe/Hg_{1-x}Cd_xTe$ with an x value from about 0.17 to about 1.0 on a CdTe substrate so that some mercury is always present in said $Hg_{1-x}Cd_xTe$ epitaxial layer.

Another object of this invention is to provide a process for growing multilayers of $CdTe/Hg_{1-x}Cd_xTe$ on a CdTe substrate which yields a structure, a CdTe/HgCdTe heterojunction, sensitive to ~2.8 micrometers at 77° K.

SUMMARY OF THE INVENTION

A HgCdTe monolithic focal plane is developed by first growing by liquid-phase epitaxial growth a HgCdTe epilayer with a desired Cd composition on a CdTe substrate, and then by growing a CdTe epilayer on the HgCdTe epilayer. In the resulting structure the HgCdTe layer is designed to sense IR radiation, and the CdTe substrate and the CdTe epilayer are effective in their function as radiation transmitter and as signal processing. The resulting structure is a heterojunction structure which detects low infrared (IR) energy in the narrow gap semiconductor and transfer the resulting charges to the wider gap semiconductor for signal processing.

In the process of this invention, $CdTe/Hg_{1-x}Cd_xTe$ multilayers with an x value from 0.3 to 0.5 are grown on CdTe substrates. The metallurgical and the electrical properties of these epitaxial layers were evaluated, and the compositions of these layers were analyzed by both the energy dispersive analysis of x-ray (EDAX) and the secondary ion mass spectroscopy (SIMS) methods. The growth parameters are presented, and the spectral response of a CdTe/HgCdTe heterojunction is given. The data reported in support of the invention represents the first successful growth of CdTe on HgCdTe and the first successful realization of CdTe/HgCdTe heterojunctions.

The HgCdTe epilayers are grown in Te solution in a modified vertical dipping LPE system designed from the liquid phase epitaxial growth system FIG. 1 disclosed in J. Electrochem. Soc. Solid-State Science and Technology, January 1980, in the article titled: "Liquid Phase Growth of HgCdTe Epitaxial Layers" by C. C. Wang et al.

BRIEF DESCRIPTION OF THE DRAWING

The Figures of the drawing depict in

DESCRIPTION OF THE PREFERRED EMBODIMENT

Figure 1:
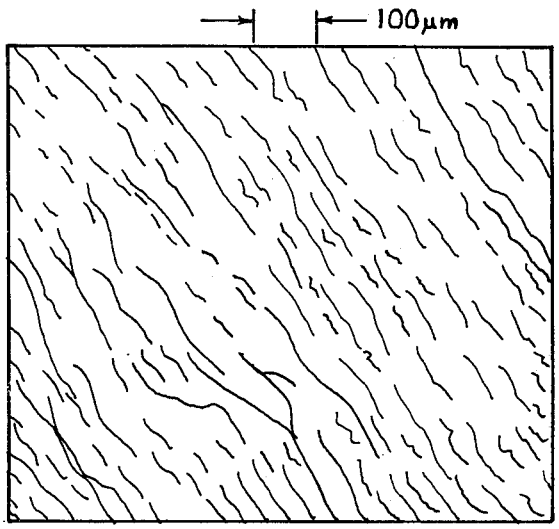
FIG. 1: an epilayer surface view which shows the surface morphology of CdTe/HgCdTe multilayer in (111)A orientation.

The multilayer growth of this invention comprises CdTe/HgCdTe grown by liquid phase epitaxial (LPE) technique on a CdTe substrate.

A suitable high pressure system utilized for the growth system of this invention consists of an inner quartz reaction tube and an outer quartz tube that is mounted between two stainless steel flanges to keep high argon gas pressure. The pressure inside the tube is maintained at 200–300 psi during growth. A positive Hg vapor pressure is maintained during the growth which is found not to be a critical parameter in growing a 20% HgCdTe layer reproducibly under high external pressure. The outer quartz tube is mounted in a vertical furnace that is controlled to within $\pm 0.05°$ C. A thermocouple is inserted into the melt to monitor the actual melt temperatures. The inner reaction tube is plugged with high purity quartz wool to prevent excess mercury evaporation from the melt. A cold zone is established just below the quartz wool in order to condense mercury vapor.

In a typical growth, CdTe substrates are first lapped and chemically polished in a $Br_2$:HBr solution followed by a $Br_2$:$CH_3OH$ etch before loading in the growth chamber. Prior to growth, appropriate amounts of high purity (99.9999%) Hg and Cd are reacted in the Te melt at $\sim 700°$ C. for an hour. For example, a typical ratio of CdTe:Hg:Te for 20% HgCdTe growth is 0.004:0.251:0.745. Subsequently, the melt and the oriented substrate are brought to the saturation temperature, typically at $\sim 500°$ C. The saturation temperature is determined empirically in the growth system. The epilayers grown from solutions initially are either saturated or unsaturated by as much as $\sim 15°$ C. In the latter case, examination of the epilayers shows that the substrates are melted back by the solution prior to growth. Through an interaction process it is possible to determine the liquid composition by dipping the known weight of CdTe into the melt of Hg and Te solutions at growth temperatures. The growth temperature normally drops at a rate of from 0.2 to 1° C./min with a typical value on the order of 0.25° C./min. In order to eliminate a Hg vapor diffused layer obtained during the heat-up cycle, the substrate is melted back at 550° C. for 15 sec in the growth solution prior to growth. A temperature profile of LPE when drawn by plotting temperature against time (hours) indicates a sharp temperature increase from ambient temperature for about 30–40 minutes to reach about 700° C. (the reaction temperature) which is maintained for about 40–60 minutes). When a known weight of the prepared CdTe substrate is dipped into the melt of Hg and Te solutions at beginning of growth temperature, the growth temperature normally drops at a rate of from 0.2° to 1° C./min with a typical value on the order of 0.25° C./min. After a predetermined time to achieve a predetermined thickness of the epilayer a cool down period from about 2 to about 3 hours is required. The actual LPE growth time takes about 30 minutes for a $\sim 30$ $\mu$m epilayer on the (111) oriented substrate, resulting in a growth rate of $\sim 1$ $\mu$m/min.

The table provides a summary of growth conditions of HgCdTe with a Cd composition of 0.2. The HgCdTe epilayers are nominally p-type when undoped CdTe substrates are used but can be converted to n-type by annealing in Hg saturated vapor at temperatures around 300° C. These layers exhibit n-type conduction when grown on In-doped CdTe presumably as a result of indium diffusion from the substrate.

The HgCdTe epilayers can be grown on CdTe substrates with (100), (110), (111) Cd, and (111) Te orientations. Layers with thickness of from 1 to 300 $\mu$m have been grown. Under normal growth conditions, the deposition rate in (100) orientation is about 2 $\mu$m/min, which is twice as fast as that in (111) orientation.

TABLE
GROWTH CONDITIONS AND PROPERTIES OF AS-GROWN HgCdTe EPILAYERS

| (I) GROWTH CONDITIONS | |
|---|---|
| Melt composition | CdTe:Hg:Te = 0.004:0.251:0.745 |
| Container pressure | $\sim 200$ psi |
| Substrate orientations | (111) A |
| Growth temperature | $\sim 500°$ C. |
| Reaction Temperature | $\sim 700°$ C. |
| Growth time | 30 min |
| Cooling rate | 0.25° C./min |
| (II) EPILAYER CHARACTERISTICS | |
| Cd composition | 0.2 |
| Thickness | 20 $\mu$m–30 $\mu$m |
| CdTe/HgCdTe transition | 0.5–1 $\mu$m |
| Carrier concentration (n-type) | $2 \times 10^{15}/cm^3$ { In-doped |
| Electron mobility | $1 \times 10^5$ $cm^2$/Vsec   Substrate |
| Carrier concentration (p-type) | $5 \times 10^{16}/cm^3$ { Undoped |
| Hole mobility | 400 $cm^2$/Vsec   Substrate |

The surface of HgCdTe epilayer grown on a (111)Cd oriented substrate is sufficiently clear that a mirror smooth surface reflects the image of an object such as a ruler placed within the view angle of the surface. For example, the inch scale of a ruler is clearly reflected and easily read from the reflection in the mirror smooth surface. As in all the other LPE growth of semiconductors, the surface quality is dependent on the orientation of the substrate. It is found that the epilayer on (111)Cd oriented substrate always has a better surface morphology than that on the (111)Te oriented surface. In fact, the quality of (111)Cd oriented surface is also better than that on (110) and (100) surfaces.

Detailed examination of the epilayer surface quality on the (111)Cd face reveals that it is mirror smooth for a thickness of less than 10 $\mu$m and shows facets and sometimes terrace substructures for layers thicker than 30 $\mu$m. The terrace surface may be due to the substrate being slightly off the (111)Cd orientation and/or liquid-solid interface instabilities; it becomes more pronounced as the thickness increases. The surface of a (111)Te epilayer usually exhibits voids across the wafer, and the density of these voids increases as the layer becomes thicker.

Before the epitaxial growth, CdTe substrates which are of a typical size of $1.5 \times 1.5$ cm are first lapped with a 3200 mesh abrasive, chemically polished with a $Br_2$:HBr solution (2% $Br_2$ in volume), cleaned in deionized water, trichloroethylene, acetone, and methanol in an ultrasonic cleaner, and finally etched with a solution of 5% by volume of bromine in methanol to remove the polishing damage.

The (111)A oriented surface is preferred for the optimum CdTe substrate surface for HgCdTe growth; therefore, all multilayers discussed herein were grown on CdTe of this orientation. The growth conditions of the first layer (HgCdTe) includes a heat and reaction cycle, a melt back cycle, an LPE growth cycle, and a cool down cycle which will be described in more detail below. The super-cooling temperature is about 0.25° C./min which produces a quality HgCdTe epilayer. The growth temperature for a HgCdTe layer is typically 550° C. Subsequent procedures in CdTe growth were similar to those of the HgCdTe growth, except that a larger supercooling temperature (>15° C.) and a faster ramping rate (1° C. to 5° C./min.) are necessary in order to avoid melting the previously grown HgCdTe high purity (99.9999%) materials of Sn, Hg, and CdTe in a ratio of Sn:Hg:CdTe of 36:5:0.15 form a second melt composition for CdTe growth layer. The starting temperature for CdTe growth typically is ~525° C. The CdTe and HgCdTe epitaxial layers are, respectively, a few $\mu$m and 10–20 $\mu$m thick.

Figure 2:
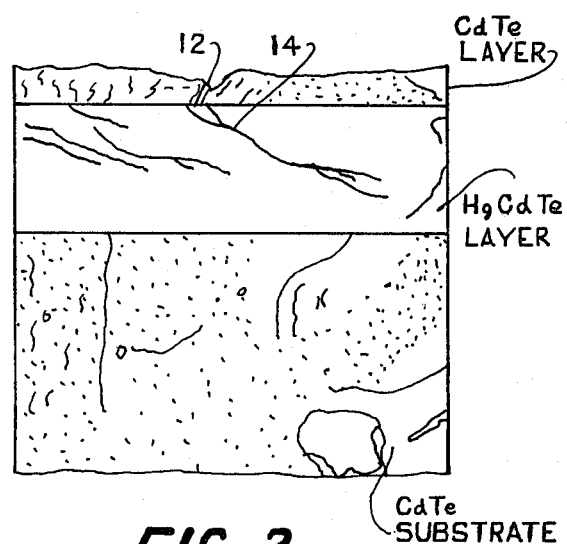
in FIG. 2: a cross-section of the double layer growth of CdTe/HgCdTe on a CdTe substrate.

In further reference to the Figures of the drawing, FIG. 1 shows the surface morphology of a CdTe/HgCdTe multilayer in (111)A orientation. The surface morphology, similar to that of HgCdTe single layers, appears to be a mirror surface to the naked eye, but shows some wavy structure under magnification. FIG. 2 shows the cross-section of a cleaved and chemically stained CdTe/HgCdTe multilayer on a CdTe substrate. The CdTe epilayer and CdTe substrate are darker because of the stain; the HgCdTe was not etched, and therefore retains a metallic color. Notice the planarity of the interfaces, indicating that minimum meltback and regrowth were taking place. The V-shape crack 12 in the CdTe layer is due to cleaving; it occurs at the end of the cleavage lines 14 as shown in the drawing. The thicknesses of CdTe and HgCdTe layers of this multilayer are 10 $\mu$m and 40 $\mu$m, respectively.

Figure 3:
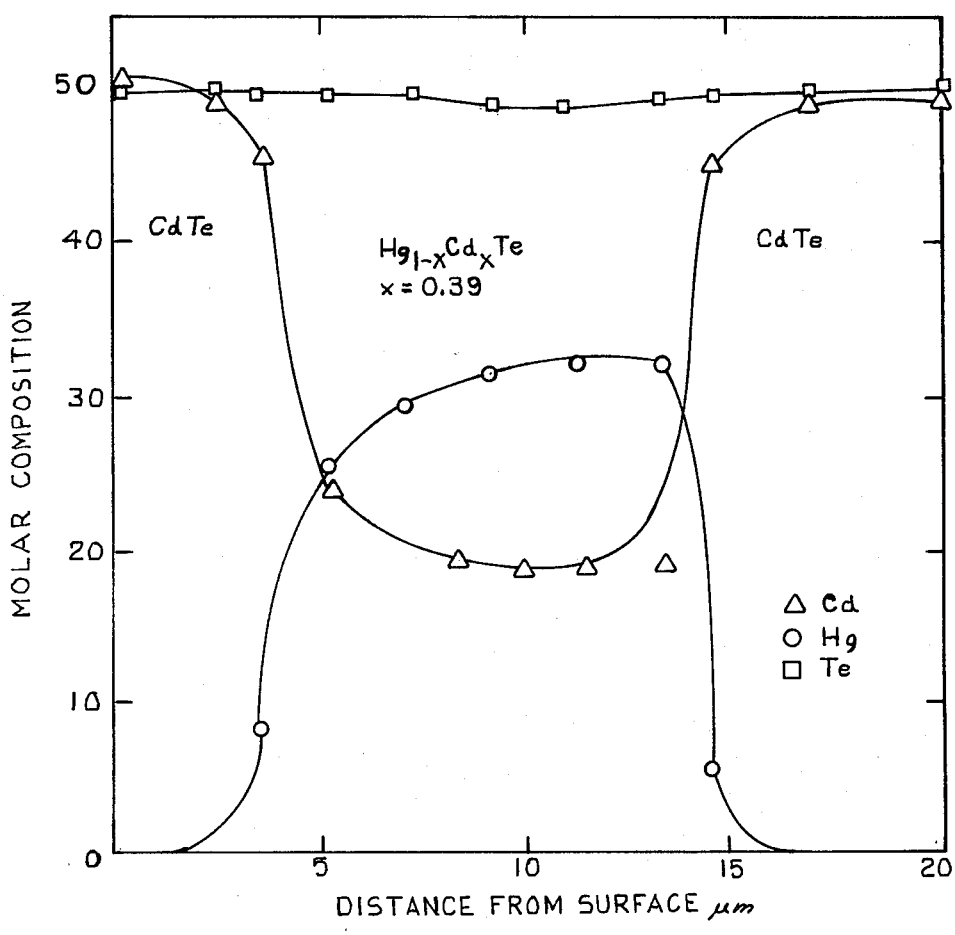
in FIG. 3: the compositional profile of CdTe/HgCdTe multilayers on a CdTe substrate.

The compositions of some multilayers were analyzed by EDAX measurements; FIG. 3 shows a typical result. The vertical axis is the molar composition, and the horizontal axis is the distance from the surface. The figure shows the interface between CdTe and HgCdTe epilayers is 5 $\mu$m from the surface, and the interface between the HgCdTe layer and the CdTe substrate is about 14 $\mu$m from the surface. The $Hg_{1-x}Cd_xTe$ layer shown in this figure has an X value of 0.39, which corresponds to a bandgap of 0.35 eV and an infrared transmission cut-on wavelength of 3.5 $\mu$m at 300 K. From FIG. 3, it can be seen that the cross-diffusion between the CdTe layer and the HgCdTe layer is much stronger than that between the HgCdTe layer and the CdTe substrate, as evidenced by the gradual transition of the Cd composition. Since the second melt (saturated with binary CdTe) is not normally in strict equilibrium with HgCdTe, the meltback often occurs during the growth of CdTe on HgCdTe. The problems related to meltback are controlled by supercooling the melt and growing the layer at a faster rate, as previously discussed.

Figure 4:
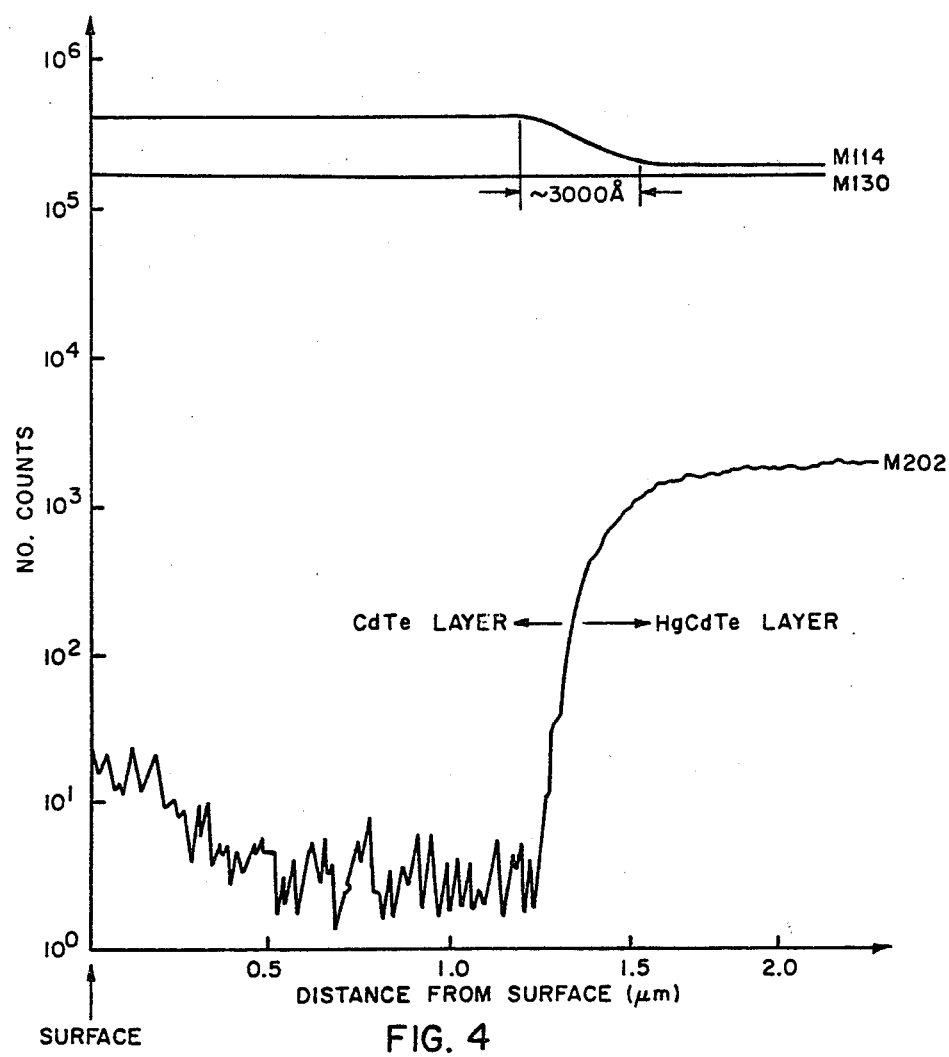
in FIG. 4: CdTe/HgCdTe grading as measured by secondary ion mass spectroscopy (SIMS)

The cross-diffusion of a CdTe/HgCdTe heterojunction has also been determined by the SIMS technique; one result is shown in FIG. 4. In this figure, M114, M130, and M202 are, respectively, Cd, Te and Hg profiles. The surface layer with a thickness of 1.2 $\mu$m is a CdTe epilayer, and no Hg was detected. The thickness of the cross-diffusion region is on the order of 3000 Å because the CdTe layer was thin and the growth time was short in this case. Below the interface there is a HgCdTe epilayer with a strong Hg signal. The accuracy of SIMS technique is ~10%, and is most convenient in examining a thickness up to ~2 $\mu$m.

Figure 5:
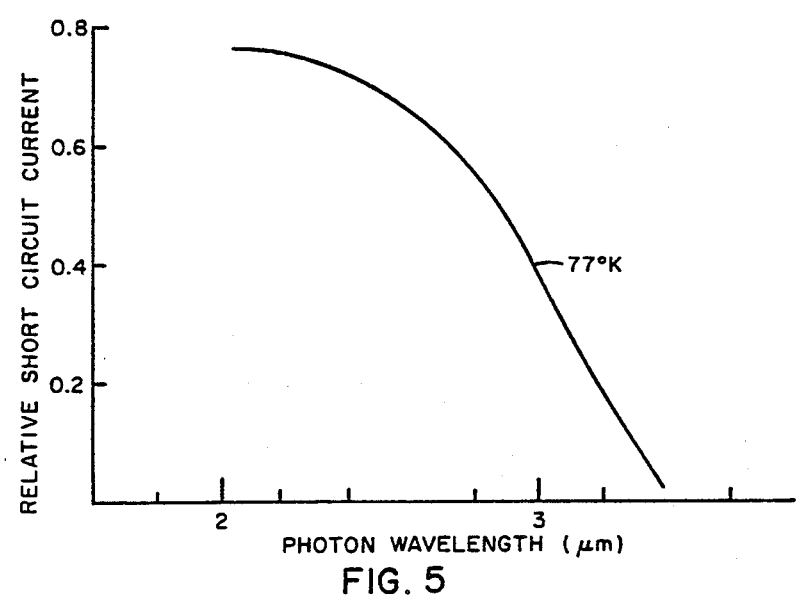
FIG. 5: the spectral response of a CdTe/HgCdTe heterojunction.

The as-grown HgCdTe layers without doping, are p-type with a carrier concentration from $5 \times 10^{16}$ to $1 \times 10^{17}$ cm$^{-3}$ and a mobility around 300 cm$^2$V$^{-1}$x$^{-1}$. These films can be converted to n-type with a carrier concentration $2 \times 10^{14}$ cm$^{-3}$ and a mobility of $2 \times 10^4$ cm$^2$V$^{-1}$s$^{-1}$, or to low carrier concentration p-type with a carrier concentration of $1 \times 10^{16}$ cm$^{-3}$ and a mobility of 650 cm$^2$V$-1_s-1$ by annealing the samples under Hg saturated vapor at temperatures around 300° C. and 400° C., respectively. The as-grown HgCdTe layers can also be n-type by doping with indium in the growth solution or by growing on an indium-doped CdTe substrate. The CdTe films are, in general, p-type with a carrier concentration of from $10^{13}$ cm$^{-3}$ to $10^{15}$ cm$^{-3}$ and a mobility of from 50 cm$^2$V$^{-1}$s$^{-1}$ to 100 cm$^2$V$^{-1}$s$^{-1}$. By using the stated multilayer formation technique, rectifying p-CdTe/n-HgCdTe heterojunctions have been fabricated. FIG. 5 shows the spectral response of such a heterojunction which consists of an n-HgCdTe with a carrier concentration of $1 \times 10^{16}$ cm$^{-3}$ and a p-CdTe with a carrier concentration of $1 \times 10^{15}$ cm$^{-3}$. At 77 K, the spectral response of this junction has a cut-off wavelength at ~2.8 $\mu$m. It represents the first reported result on CdTe/HgCdTe heterojunctions.

The achievement of this invention of growing a CdTe epilayer on a HgCdTe epilayer that is first grown on a prepared substrate of CdTe is significant when one considers the difficult metallurgical problem encountered because of the associated high Hg vapor pressure during growth and the non-equilibrium nature between the saturated CdTe melt and HgCdTe. The results demonstrate that the growth of CdTe and HgCdTe epilayers on a CdTe substrate yields the first CdTe/HgCdTe heterojunction which is sensitive to 2.8 $\mu$m at 77 K. The disclosed epitaxial technology is the basic elements of the structure recognized as a monolithic structure in which a HgCdTe epilayer is employed for infrared detector in combination with a CdTe layer which is employed for signal processing. The process of this invention makes possible the achievement of a combination which has significant utility in infrared sensor technology.

We claim:
1. A liquid-phase-epitaxial method for growing a CdTe epitaxial layer on a HgCdTe epitaxial layer that has been grown on a CdTe substrate that has been mechanically and chemically polished, said method comprising:
(i) preparing a CdTe substrate with a predetermined oriented surface selected from the surfaces of (100), (110), (111)Cd, and (111)Te by lapping said substrate with a 3200 mesh abrasive, chemically polishing with a $Br_2$:$HBr_2$ solution of about 2% bromine by volume, cleaning in deionized water, trichloroethylene, acetone, and methanol in an ultrasonic cleaner, and finally by etching with a solution of about 5% by volume bromine in methanol to remove the polishing damage;
(ii) reacting in accordance with a first predetermined temperature profile an appropriate amount of high purity (99.9999%) Hg, Cd, and Te in a first melt composition, said first melt composition being CdTe:Hg:Te in ratio 0.004:0.251:0.745 which is contained in a first high pressure liquid-epitaxial-growth system apparatus comprising an inner quartz reaction tube and an outer quartz tube mounted in a vertical furnace that is controlled to within ±0.05° C., said outer quartz tube mounted between two stainless steel flanges to keep high argon gas pressure and to control the high mercury vapor pressure over said first melt composition containing said CdTe, Hg, and Te, said reacting in accordance with said first predetermined temperature profile including a heat-up time period of about 40 minutes from ambient temperature to a temperature of about 700° C. which is the reacting temperature of said first predetermined temperature profile that is maintained for a time period of about one hour;

(iii) reducing said reacting temperature of said first melt composition to about 550° C. which is the melt back temperature of said first predetermined temperature profile;

(iv) inserting said prepared CdTe substrate that is retained on a quartz sample holder into said first melt composition to allow said prepared CdTe substrate to melt back for about 15 seconds to eliminate a Hg vapor diffusion layer obtained during said heat-up time period and then reducing said temperature to the liquid-epitaxial-growth temperature which initially starts the growth time at a temperature within about 15° C. of the saturated or unsaturated temperature of said first melt composition, and said growth time taking place over a period of up to about 30 minutes;

(v) growing an epitaxial layer on said selected oriented surface of said substrate at a rate of about 1 micrometer per °C. as the growth temperature drops at a rate of from about 0.2 to about 1° C. per minute, said epitaxial layer being a layer of $Hg_{1-x}Cd_xTe$ on said selected oriented surface of said substrate of a predetermined thickness, with x being a value from about 0.17 to about 1.0 so that some mercury is always present in $Hg_{1-x}Cd_xTe$ layer, during said liquid-epitaxial-growth temperature period of said first predetermined temperature profile;

(vi) removing said inserted CdTe substrate retained on said quartz sample holder from said first melt composition and reducing the temperature at the completion of said liquid-epitaxial-growth temperature period to ambient temperature during a cool down period of said first predetermined temperature profile of from about 2 to about 3 hours;

(vii) positioning said substrate with said grown epitaxial layer of said $Hg_{1-x}Cd_xTe$ in a second high pressure liquid-epitaxial-growth system apparatus which is loaded with a predetermined amount of a high purity (99.9999%) materials of Sn, Hg, and CdTe in a ratio of Sn:Hg:CdTe which equals 36:5:0.15, said materials forming a growth solution when molten for the growth of an epitaxial layer of CdTe on said epitaxial layer of said $Hg_{1-x}Cd_xTe$;

(viii) reacting in accordance with a second predetermined temperature profile said materials of Sn:Hg:CdTe to form a second melt composition which is contained in a said second high pressure liquid-epitaxial-growth system apparatus of a like set-up defined for said first high pressure liquid-epitaxial-growth system apparatus, said reacting in accordance with said second predetermined temperature profile including a heat-up time period of about 40 minutes from ambient temperature to a temperature of about 700° C. which is the reacting temperature of said second predetermined temperature profile that is maintained for a time period of about one hour;

(ix) reducing said reacting temperature of said second melt composition from about 700° C. to about 525° C. which is the starting temperature for CdTe epitaxial layer growth;

(x) inserting said substrate with said grown epitaxial layer of said $Hg_{1-x}Cd_xTe$ into said second melt composition and supercooling said second melt composition at a rate from about 1° C. to about 5° C. per minute which is necessary to avoid melting said epitaxial layer of said $Hg_{1-x}Cd_xTe$ during the epitaxial growing of a CdTe layer on said $Hg_{1-x}Cd_xTe$;

(xi) growing an epitaxial layer of CdTe on said $Hg_{1-x}Cd_xTe$ layer as the growth temperature drops during said supercooling at said rate from about 1° C. to about 5° C. per minute to complete a supercooling temperature range greater than 15° C. and an epitaxial layer of CdTe of a few micrometers thickness; and (xii) removing said inserted substrate with said grown epitaxial layers of $Hg_{1-x}Cd_xTe$ and CdTe thereon from said second melt composition and reducing the temperature at the completion of said liquid-epitaxial-growth temperature period to ambient temperature during a cool down period of said predetermined temperature profile of from about 2 to about 3 hours.

2. The method of claim 1 wherein said predetermined oriented surface selected is the (111)Cd surface of said CdTe substrate, said $Hg_{1-x}Cd_xTe$ epitaxial layer wherein x has a value of 0.39, which corresponds to a bandgap of 0.35 eV and an infrared transmission cut-on wavelength of 3.5 micrometers at 300° K.

3. The method of claim 1 wherein said predetermined oriented surface selected is the (111)Cd surface of said CdTe substrate, said $Hg_{1-x}Cd_xTe$ epitaxial layer grown on said substrate having an x value from about 0.3 to about 0.5, said $Hg_{1-x}Cd_xTe$ epitaxial layer having a thickness from about 10 to about 20 micrometers, and said epitaxial layer of CdTe grown on said $Hg_{1-x}Cd_xTe$ epitaxial layer being from about 1 to about 2 micrometers thickness, said CdTe substrate with said $Hg_{1-x}Cd_xTe$ epitaxial layer grown thereon and said $Hg_{1-x}Cd_xTe$ epitaxial layer with said CdTe epitaxial layer grown thereon forming a heterojunction for an infrared sensitive device characterized by being sensitive to 2.8 micrometers infrared at 77° K.

* * * * *